US012782483B2

(12) United States Patent
Grodzki et al.

(10) Patent No.: US 12,782,483 B2
(45) Date of Patent: Nov. 3, 2026

(54) OF A MAGNETIC RESONANCE SEQUENCE, MAGNETIC RESONANCE APPARATUS AND COMPUTER PROGRAM PRODUCT

(71) Applicant: Siemens Healthcare GmbH, Erlangen (DE)

(72) Inventors: David Grodzki, Erlangen (DE); Dominik Paul, Bubenruth (DE)

(73) Assignee: Siemens Healthineers AG, Forchheim (DE)

( * ) Notice: Subject to any disclaimer, the term of this patent is extended or adjusted under 35 U.S.C. 154(b) by 166 days.

(21) Appl. No.: 18/499,808

(22) Filed: Nov. 1, 2023

(65) Prior Publication Data

US 2024/0151795 A1 May 9, 2024

(30) Foreign Application Priority Data

Nov. 9, 2022 (EP) .................................... 22206365

(51) Int. Cl.

*G01R 33/54* (2006.01)
*G01R 33/28* (2006.01)
*G01R 33/561* (2006.01)
*G01R 33/58* (2006.01)

(52) U.S. Cl.

CPC ......... *G01R 33/543* (2013.01); *G01R 33/288* (2013.01); *G01R 33/5612* (2013.01); *G01R 33/583* (2013.01)

(58) Field of Classification Search

CPC .............. G01R 33/543; G01R 33/3614; G01R 33/5612; G01R 33/583; G01R 33/288

See application file for complete search history.

(56) References Cited

U.S. PATENT DOCUMENTS 11,448,716 B1 * 9/2022 Majeed .................. G01R 33/38
11,921,180 B2 * 3/2024 Feiweier ............ G01R 33/5659

(Continued)

OTHER PUBLICATIONS

Collins Christopher M. et al., "Calculations of B1 distribution, SNR, and SAR for a surface coil adjacent to an anatomically-accurate human body model," Magnetic Resonance in Medicine, Bd. 45, Nr. 4, 1. Jan. 2001, pp. 692-699.

(Continued)

*Primary Examiner* — Rishi R Patel

(74) *Attorney, Agent, or Firm* — Lempia Summerfield Katz LLC

(57) ABSTRACT

A method for calculating an operating parameter of a magnetic resonance sequence, a magnetic resonance apparatus, and a computer program product are disclosed. According to the method, at least one initial sequence parameter of a radio-frequency (RF) transmit pulse of the magnetic resonance sequence is provided. In addition, at least one test RF transmit pulse is determined, (e.g., calculated and/or modeled and/or simulated), wherein the at least one test RF transmit pulse is adapted based on the at least one initial sequence parameter to a specified, in particular geometric, standard shape. The at least one operating parameter is determined, (e.g., calculated), with the assistance of the at least one test RF transmit pulse. It is in particular assumed in this respect that the at least one test RF transmit pulse is applied on performance of the magnetic resonance sequence.

13 Claims, 2 Drawing Sheets

(56) References Cited

U.S. PATENT DOCUMENTS

| | | | | |
|---|---|---|---|---|
| 2011/0133734 | A1* | 6/2011 | Freytag | G01R 33/3614 324/318 |
| 2013/0144156 | A1* | 6/2013 | Boulant | G01R 33/5612 600/410 |
| 2015/0097566 | A1* | 4/2015 | Grodzki | G01R 33/543 324/322 |
| 2015/0338488 | A1* | 11/2015 | Nittka | G01R 33/5618 324/309 |
| 2021/0208228 | A1* | 7/2021 | Grodzki | G01R 33/50 |
| 2021/0278492 | A1 | 9/2021 | Grodzki et al. | |
| 2022/0187401 | A1 | 6/2022 | Feiweier et al. | |

OTHER PUBLICATIONS

Wald Lawrence, et al., "Specific Absorption Rate (SAR) in Parallel Transmission (pTx)," Magnetom Flash, Bd. 1, Nr. 2010, 1. Jan. 2010, pp. 65-73.

* cited by examiner

OF A MAGNETIC RESONANCE SEQUENCE, MAGNETIC RESONANCE APPARATUS AND COMPUTER PROGRAM PRODUCT

The present patent document claims the benefit of European Patent Application No. 22206365.3, filed Nov. 9, 2022, which is hereby incorporated by reference in its entirety.

TECHNICAL FIELD

The disclosure relates to a method for calculating an operating parameter of a magnetic resonance sequence, a magnetic resonance apparatus, and a computer program product.

BACKGROUND

In medical technology, imaging by way of magnetic resonance (MR), also known as magnetic resonance tomography (MRT) or magnetic resonance imaging (MRI), is distinguished by high soft tissue contrast. Such imaging involves using a magnetic resonance apparatus during magnetic resonance measurement to irradiate radio-frequency (RF) pulses for generating an RF field (also known as a B1 field) and gradient pulses for generating a magnetic field gradient according to a magnetic resonance sequence into an examination region in which a patient is situated. In this way, spatially encoded echo signals are triggered in the patient, the signals also being referred to as magnetic resonance signals. The magnetic resonance signals are received as measurement data by the magnetic resonance apparatus and used to reconstruct magnetic resonance images.

Prior to performance of a magnetic resonance measurement, the operating parameters of the magnetic resonance sequence may be checked to confirm the parameters are suited to complying with certain constraints. Such constraints may arise from the capabilities of the magnetic resonance apparatus and/or patient safety concerns. This check may sometimes be very time-consuming.

SUMMARY AND DESCRIPTION

The object of the present disclosure may be considered to be that of speeding up the calculation of operating parameters of a magnetic resonance sequence.

The scope of the present disclosure is defined solely by the appended claims and is not affected to any degree by the statements within this summary. The present embodiments may obviate one or more of the drawbacks or limitations in the related art.

A computer-implemented method for calculating at least one operating parameter of a magnetic resonance sequence is proposed. In this respect, at least one initial sequence parameter of an RF transmit pulse of the magnetic resonance sequence is provided. In addition, at least one test RF transmit pulse is determined, in particular calculated and/or modeled and/or simulated. In this respect, the at least one test RF transmit pulse is adapted based on the at least one initial sequence parameter to a specified, in particular geometric, standard shape. The at least one operating parameter is determined, in particular calculated, with the assistance of the at least one test RF transmit pulse.

In particular, when determining the at least one operating parameter, it is assumed that the at least one test RF transmit pulse is applied on performance of the magnetic resonance sequence. In particular, the at least one operating parameter is determined for the case in which the at least one test RF transmit pulse is used as the RF transmit pulse. For example, it is checked thereby what value the at least one operating parameter assumes if the at least one test RF transmit pulse is used as the RF transmit pulse.

The magnetic resonance sequence may include at least one sequence module. A sequence module may be an RF transmit pulse or a gradient pulse. The magnetic resonance sequence may include a plurality of sequence modules that are applied over the course of the magnetic resonance measurement. The sequence modules may be applied one after the other timewise and/or at least in part simultaneously (in particular overlapping timewise). The at least one initial sequence parameter and/or the at least one adapted sequence parameter may be a property of the at least one sequence module.

Determination of the at least one operating parameter may advantageously be simplified by using the specified standard shape. The computing operations necessary therefor may advantageously be reduced. The specified standard shape may be of lower complexity than an actual shape of an RF transmit pulse. The specified standard shape advantageously constitutes an approximation of an actual shape of an RF transmit pulse.

The at least one test RF transmit pulse may have the specified standard shape, which is established by the at least one initial sequence parameter. The at least one test RF transmit pulse may be described by a modeling function, (e.g., a mathematical modeling function), which corresponds to the specified standard shape.

The standard shape may be characterized in that the shape describes an amplitude and/or area that are in each case at least as large as an amplitude and/or area of any measurement RF transmit pulse to be determined.

The specified standard shape may be a rectangular shape. The at least one test RF transmit pulse may then be described by a rectangular function as modeling function. A rectangular shape is advantageously particularly suitable for simplifying the approximation of an RF transmit pulse, in particular of any measurement RF transmit pulse to be determined.

A rectangular shape is advantageously particularly good for approximating a dynamic pulse. For other possible pulse types, other shapes may also be particularly well suited to approximating the expected RF transmit pulse.

The at least one operating parameter may describe a state of the magnetic resonance apparatus and/or of the patient during a magnetic resonance measurement. In particular, the at least one operating parameter is dependent on the nature of the at least one sequence module of the magnetic resonance sequence, based on which the magnetic resonance measurement is carried out.

The at least one initial sequence parameter may include an, in particular maximum, (initial) pulse duration of the at least one RF transmit pulse that corresponds to a width, (e.g., a maximum width), of the rectangular shape. The at least one initial sequence parameter may include an, in particular maximum, (initial) amplitude of the at least one RF transmit pulse that corresponds to a height, (e.g., a maximum height), of the rectangular shape. A long-lasting RF transmit pulse is thus for example modeled by a rectangle with a large width; a strong one is thus modeled for example by a rectangle with a large height.

The (initial) pulse duration is specified, for example, for a magnetic resonance sequence to be carried out. Specification of the (initial) pulse duration may be specific to the type of magnetic resonance sequence. Specification of the (initial) pulse duration may however also be individually adjusted for a specific magnetic resonance measurement, for example, by a magnetic resonance apparatus operator.

The at least one operating parameter may include a power requirement applicable to the magnetic resonance apparatus, in particular to a radio-frequency amplifier of the magnetic resonance apparatus with which the magnetic resonance sequence is to be executed. A power requirement applicable to a radio-frequency amplifier of the magnetic resonance apparatus may be a requirement for electrical rechargeability of the radio-frequency amplifier and/or a maximum electrical charging capacity of the radio-frequency amplifier.

Rechargeability may be described by a rate at which electrical recharging of the radio-frequency amplifier takes place. This may be expressed in coulombs/second. The maximum electrical charging capacity may be described by the maximum electrical charge that may be (temporarily) stored and drawn from for sending transmit pulses. This may be expressed in coulombs.

The at least one operating parameter may include a specific absorption rate to which a patient is exposed on performance of the magnetic resonance sequence.

The specific absorption rate may be the radio-frequency energy absorbed per unit time and per kilogram of body weight after RF irradiation. Absorption of RF energy may lead to heating of the patient's body tissue. In the case of an inadmissibly high local concentration of RF energy, RF burns may occur (local SAR). If the RF energy is distributed evenly over the entire body, the burden on the patient's thermoregulation or cardiovascular system is significant (whole-body SAR). The at least one constraint may include a short-term SAR limit, (e.g., an SAR limit of 10 seconds).

Furthermore, at least one constraint may be provided relating to the at least one operating parameter and at least one adapted sequence parameter is determined by adapting the at least one initial sequence parameter to comply with the provided at least one constraint.

For example, an SAR limit value and/or a power limit of the magnetic resonance apparatus, (e.g., of a radio-frequency amplifier of the magnetic resonance apparatus), is provided as the at least one constraint. Advantageously, patient safety and/or the operational reliability of the magnetic resonance apparatus, in particular protection of components of the magnetic resonance apparatus, may be enhanced thereby.

Determination of the at least one adapted sequence parameter may be carried out in particular using an iterative method. It is possible, based on the at least one initial sequence parameter, to determine at least one first sequence parameter, whereupon it is checked whether the at least one constraint provided is complied with on application of the at least one first sequence parameter. If the at least one constraint is complied with, the at least one first sequence parameter is the at least one adapted sequence parameter. If the at least one constraint is not complied with, at least one second sequence parameter is determined, which is then used in a further check, etc.

According to a further embodiment, the method further includes determining at least one measurement RF transmit pulse based on the at least one adapted sequence parameter. The at least one adapted sequence parameter may represent at least one constraint and/or requirement and/or restriction for determining the at least one measurement RF transmit pulse.

In particular, a magnetic resonance measurement may be performed according to a magnetic resonance sequence, wherein the magnetic resonance sequence includes the at least one measurement RF transmit pulse. The magnetic resonance signals may advantageously be received by the magnetic resonance measurement, wherein at least one magnetic resonance image is produced from the magnetic resonance signals.

The at least one measurement RF transmit pulse may be a dynamic pulse, e.g., a pTx pulse.

The dynamic pulse may be considered to take the form of an RF transmit pulse, the phase and/or amplitude of which varies over the course of the pulse, while an in particular predetermined gradient trajectory is sampled by a gradient coil unit of the magnetic resonance apparatus. Sampling of the gradient trajectory in particular proceeds at the same time as the variation of phase and/or amplitude of the RF transmit pulse.

It is also conceivable to consider the RF transmit pulse and gradient trajectory as a whole as the dynamic pulse. The RF transmit pulse would then be part of the dynamic pulse.

The term "pTx" here denotes "parallel transmission." A pTx pulse may include a plurality of sub-pulses transmitted in parallel, (e.g., simultaneously), in each case by a transmit antenna of a radio-frequency antenna unit of the magnetic resonance apparatus. Each transmit antenna may in turn have a transmit channel assigned to it. The sub-pulses may differ in shape and/or amplitude and/or phase. The sub-pulses may moreover display a time delay relative to one another. For example, an emissible RF transmit pulse is composed of a plurality of sub-pulses, which differ from one another and may in each case be transmitted by a transmit antenna of a multichannel transmit antenna assembly of the radio-frequency antenna unit. At least some sub-pulses of the plurality of sub-pulses, (e.g., all of the sub-pulses), may be dynamic pulses.

A dynamic pulse may advantageously provide more precise control of the B1 field generated thereby; such control may be particularly advantageous in applications with a reduced field of view, shaped saturation bands or to reduce the specific absorption rate. In particular, a pTx pulse may be used to compensate magnetic field inhomogeneities (for example, in the course of "RF shimming"), which may be particularly advantageous above all at higher field strengths of the main magnetic field from 7 Tesla upward.

On transmission of a dynamic pulse, (e.g., a pTx pulse), a predetermined spatial distribution of the excitation may advantageously be achieved, as an additional degree of freedom through interference of the signals of the plurality of transmit channels, over a plurality of transmit antennas of the radio-frequency antenna unit, this being adjusted on determination of the dynamic pulse for example by varying phase and amplitude.

The at least one shape and/or amplitude and/or phase of the RF transmit pulse or of a sub-pulse may correspond to a shape and/or amplitude and/or phase of a voltage pulse applied to the respective transmit antenna, and/or of a current pulse flowing through the transmit antenna.

The at least one shape and/or amplitude and/or phase of the gradient pulse may correspond to a shape and/or amplitude and/or phase of a voltage pulse applied to the gradient coil unit, and/or of a current pulse flowing through the gradient coil unit.

The at least one adapted sequence parameter may include at least one constraint for determining the at least one measurement RF transmit pulse. The at least one adapted sequence parameter may include, (e.g., as at least one constraint), a maximum pulse duration and/or a maximum amplitude for determining the at least one measurement RF transmit pulse. In particular, the at least one adapted sequence parameter specifies a maximum pulse duration and/or a maximum amplitude for determining the at least one measurement RF transmit pulse, (i.e., the width of the at least one measurement RF transmit pulse amounts at most to the maximum pulse duration, and/or the amplitude of the at least one measurement RF transmit pulse amounts at most to the maximum amplitude).

In particular, when the at least one test RF transmit pulse is approximated by a rectangular pulse, although the (actual) at least one measurement RF transmit pulse is conventionally "overestimated," this is advantageously only to such a small extent that performance losses that may be associated therewith are entirely acceptable. On the other hand, the time saving on determination of the at least one operating parameter may be considerable.

Furthermore, a magnetic resonance apparatus is proposed that is configured to carry out an above-described method for calculating at least one operating parameter of a magnetic resonance sequence. The magnetic resonance apparatus may include a computing unit with one or more processors and/or storage modules. The computing unit may be configured as part of a system control unit of the magnetic resonance apparatus.

The advantages of the proposed magnetic resonance apparatus substantially correspond to the advantages of the proposed method for calculating at least one operating parameter of a magnetic resonance sequence, which have been described in detail above. Features, advantages, or alternative embodiments mentioned in this connection are likewise also applicable to the other claimed subjects and vice versa.

Furthermore, a computer program product is proposed that includes a program and is directly loadable into a memory of a programmable system control unit of a magnetic resonance apparatus and has program means, (e.g., libraries and auxiliary functions), for carrying out a method as proposed above when the computer program product is executed in the system control unit of the magnetic resonance apparatus. The computer program product may include software with source code that has yet to be compiled and linked or has merely to be interpreted, or executable software code that has merely to be loaded into the system control unit for execution.

As a result of the computer program product, the method may be carried out quickly, identically repeatably, and robustly. The computer program product is configured such that it may carry out the method acts by way of the system control unit. The system control unit includes the prerequisites such as an appropriate working memory, an appropriate graphics card, or an appropriate logic unit for the system control unit to be possible to carry out the respective method acts efficiently.

The computer program product may be stored on a computer-readable medium or saved to a network or server, from where the computer program product may be loaded into the processor of a local system control unit that may be directly connected with the magnetic resonance apparatus or may be configured as part of the magnetic resonance apparatus. Control information for the computer program product may furthermore be stored on an electronically readable data storage medium. The control information of the electronically readable data storage medium may be configured such that, when the data storage medium is used in a system control unit of a magnetic resonance apparatus, it carries out a method as described herein.

Examples of electronically readable data storage media are a DVD, a magnetic tape, or a USB stick on which electronically readable control information, in particular software, is stored. If this control information is read from the data storage medium and stored in a system control unit of the magnetic resonance apparatus, all the embodiments of the previously described methods may be carried out.

BRIEF DESCRIPTION OF THE DRAWINGS

Further advantages, features, and details of the disclosure are revealed by the embodiments described below with reference to the drawings. Mutually corresponding parts are provided with the same reference characters in all the figures.

DETAILED DESCRIPTION

Figure 1:
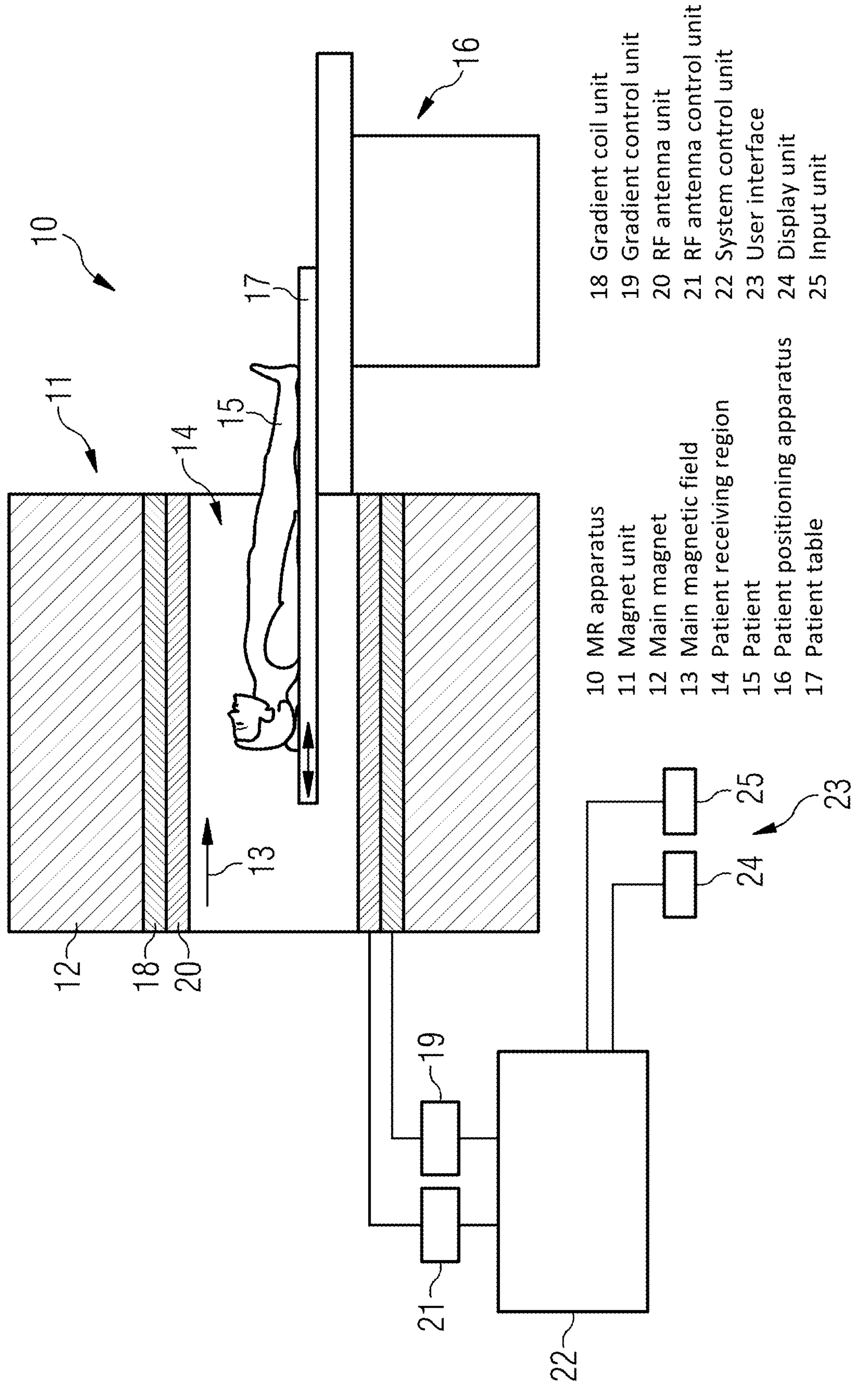
FIG. 1 is a schematic representation of an example of a magnetic resonance apparatus.

FIG. 1 is a schematic representation of a magnetic resonance apparatus 10. The magnetic resonance apparatus 10 includes a magnet unit 11 that has a main magnet 12 for generating a strong and in particular time-constant main magnetic field 13. The magnetic resonance apparatus 10 additionally includes a patient receiving region 14 for accommodating a patient 15. In the present embodiment, the patient receiving region 14 has a cylindrical construction and is cylindrically surrounded in a circumferential direction by the magnet unit 11. In principle, however, a different configuration of the patient receiving region 14 is conceivable. The patient 15 may be advanced into the patient receiving region 14 by way of a patient positioning apparatus 16 of the magnetic resonance apparatus 10. The patient positioning apparatus 16 includes a patient table 17 that is movable within the patient receiving region 14.

The magnet unit 11 furthermore includes a gradient coil unit 18 for generating magnetic field gradients that are used for spatial encoding during imaging. The gradient coil unit 18 is controlled by a gradient control unit 19 of the magnetic resonance apparatus 10. The magnet unit 11 further includes a radio-frequency antenna unit 20, which is configured in the present embodiment as a body coil permanently integrated into the magnetic resonance apparatus 10. The radio-frequency antenna unit 20 is controlled by a radio-frequency antenna control unit 21 of the magnetic resonance apparatus 10 and emits radio-frequency transmit pulses, (e.g., at least one test RF transmit pulse and/or measurement RF transmit pulse), into an examination space that is substantially formed by a patient receiving region 14 of the magnetic resonance apparatus 10. In this way, excitation of atomic nuclei is established in the main magnetic field 13 generated by the main magnet 12. Magnetic resonance signals are generated by relaxation of the excited atomic nuclei. The radio-frequency antenna unit 20 is configured to receive magnetic resonance signals.

To transmit suitable electrical signals to the radio-frequency antenna unit 20, the radio-frequency antenna control unit 21 includes one or more radio-frequency amplifiers (not shown here) that may amplify a control signal of the system control unit 22 into a power signal. The radio-frequency amplifier is configured to temporarily store an electrical charge, in particular precharge, which it then draws from on amplification of a transmit pulse. This enables the radio-frequency amplifier to amplify transmit pulses with a high edge steepness. To store the electrical charge, the radio-frequency amplifier may include at least one capacitor.

The radio-frequency antenna unit 20 may include a plurality of transmit antennas. In particular, the radio-frequency antenna unit 20 may be configured to generate, in particular transmit, dynamic pulses. Radio-frequency antenna unit 20 may additionally or alternatively include a local transmit coil (not shown here) with one or more transmit antennas, which may be arranged directly on the patient 15. This is advantageous above all with magnetic resonance apparatuses 10 with a strong main magnetic field 13, (e.g., 7 Tesla or more).

The magnetic resonance apparatus 10 includes a system control unit 22 for controlling the main magnet 12 and the gradient control unit 19 and for controlling the radio-frequency antenna control unit 21. The system control unit 22 centrally controls the magnetic resonance apparatus 10, such as the performance of a magnetic resonance sequence. The system control unit 22 may be configured to calculate at least one operating parameter of the magnetic resonance sequence according to the method according to FIG. 2. In addition, the system control unit 22 includes an evaluation unit, not shown in any more detail, for evaluating the magnetic resonance signals that are acquired during the magnetic resonance examination. The magnetic resonance apparatus 10 furthermore includes a user interface 23 connected to the system control unit 22. Control information, (e.g., imaging parameters), and reconstructed magnetic resonance images may be displayed on a display unit 24, (e.g., on at least one monitor), of the user interface 23 for a medical operator. The user interface 23 furthermore includes an input unit 25, by way of which information and/or parameters may be input by the medical operator during a measurement procedure.

Figure 2:
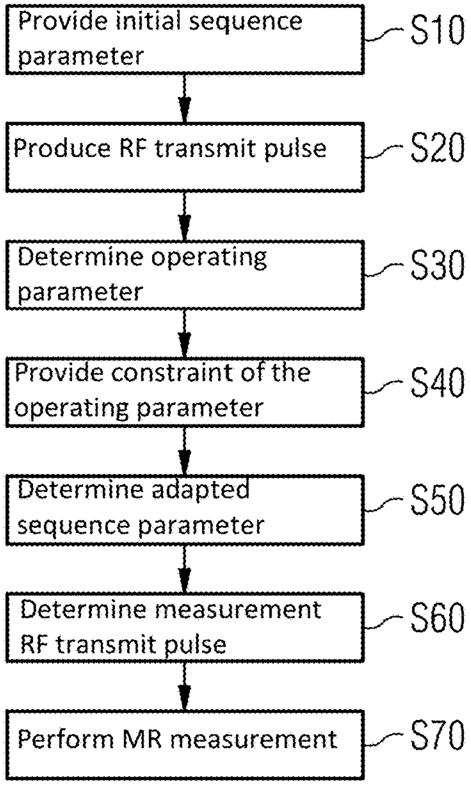
FIG. 2 is a block diagram of an example of a method for calculating an operating parameter of a magnetic resonance sequence.

According to the method shown in FIG. 2, in S10, at least one initial sequence parameter of an RF transmit pulse of a magnetic resonance sequence is provided. Provision may proceed by loading the at least one initial sequence parameter from a database and/or by input of the at least one initial sequence parameter by the operator by the user interface 23. A magnetic resonance sequence may be loaded from the database for which the at least one sequence parameter, (e.g., a pulse duration), is specified. Transfer of the at least one sequence parameter, (e.g., the pulse duration), may run automatically in the background and/or may not be visible or may only be indirectly visible to the operator.

Furthermore, provision of the at least one initial sequence parameter of the RF transmit pulse may include the provision of an, in particular maximum, amplitude of the RF transmit pulse. This is determined, for example, from an amplitude maximally generable by the magnetic resonance apparatus and/or from a reference voltage of the patient 15, which reference voltage is established in at least one possible prior measurement. Provision of the amplitude may also proceed automatically and/or in a manner not or only indirectly visible to the operator.

In S20, at least one test RF transmit pulse is produced, the at least one test RF transmit pulse being adapted based on the at least one initial sequence parameter to a specified standard shape.

The standard shape may be a rectangular shape. In this respect, the at least one initial sequence parameter provided in S10 may include a pulse duration, (e.g., a maximum pulse duration), which corresponds to a width, (e.g., a maximum width), of the rectangular shape. Furthermore, the at least one initial sequence parameter may include an, in particular maximum, amplitude, which corresponds to a height, (e.g., a maximum height), of the rectangular shape.

In S30, at least one operating parameter is determined with the assistance of the at least one test RF transmit pulse. The at least one operating parameter may include a power requirement applicable to the magnetic resonance apparatus 10, (e.g., to a radio-frequency amplifier of the magnetic resonance apparatus 10), which requirement is to be met on performance of the magnetic resonance sequence by the magnetic resonance apparatus, in particular by the radio-frequency amplifier. Furthermore, the at least one operating parameter may include a specific absorption rate to which a patient 15 is exposed on performance of the magnetic resonance sequence.

In S40, at least one constraint, (e.g., a power limit of the radio-frequency amplifier and/or an SAR limit value), is provided to the at least one operating parameter. In certain examples, S40 may also take place before S10, S20, or S30 and/or at the same time as S10, S20, or S30.

In S50, at least one adapted sequence parameter is determined by adapting the at least one initial sequence parameter to comply with the provided at least one constraint.

In S60, at least one measurement RF transmit pulse, (e.g., a dynamic pulse), is determined with the assistance of the at least one adapted sequence parameter.

In S70, a magnetic resonance measurement is performed according to a magnetic resonance sequence, the magnetic resonance sequence including the at least one measuring RF transmit pulse, such that the at least one measurement RF transmit pulse is applied at least once during the magnetic resonance measurement. The magnetic resonance signals may advantageously be received by the magnetic resonance measurement, at least one magnetic resonance image being produced, (e.g., reconstructed), from the magnetic resonance signals.

Figure 3:
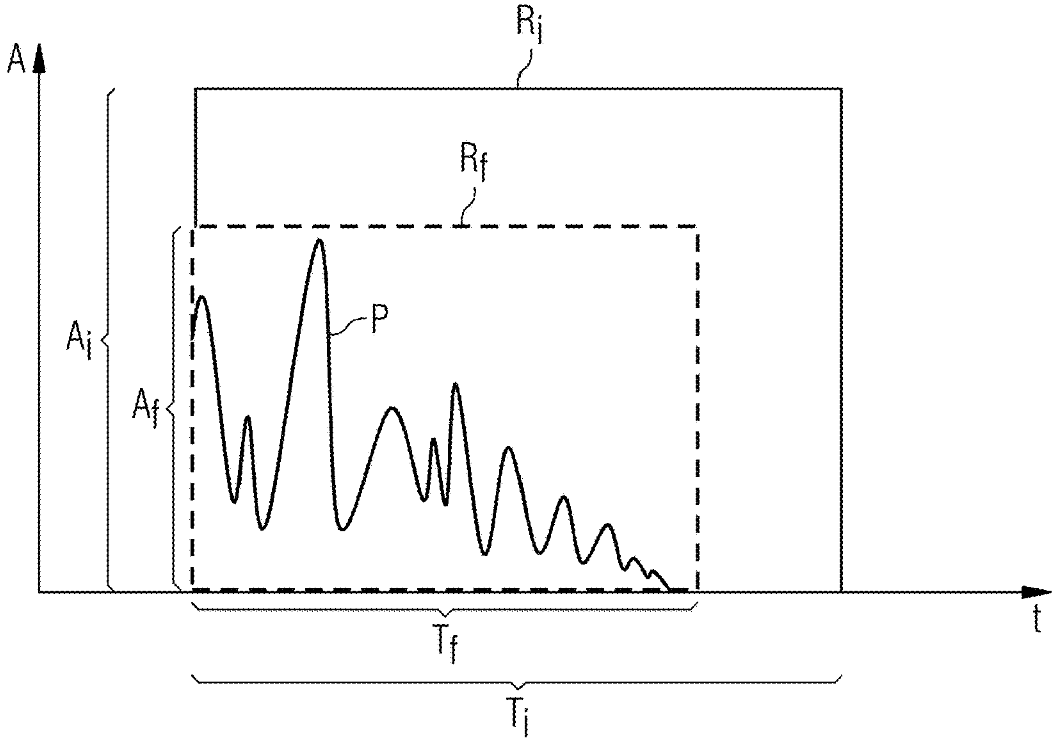
FIG. 3 depicts an example of rectangular test RF transmit pulses and a measurement RF transmit pulse.

The proposed method is particularly suitable for determining dynamic pulses. This is further clarified based on FIG. 3, in which an initial rectangular pulse $R_i$ is shown as a test RF transmit pulse determined in S20. The width thereof corresponds to an initial pulse duration $T_i$ as a first initial sequence parameter, and the height thereof corresponds to an initial amplitude $A_i$ as a second initial sequence parameter, which initial sequence parameters are in each case provided in S10.

The at least one operating parameter is determined in S30 based on the initial rectangular pulse $R_i$. In particular, the situation is simulated of the radio-frequency antenna unit 20 emitting the rectangular pulse $R_i$ as an RF transmit pulse, in order to determine the resultant at least one operating parameter. This at least one operating parameter may then be compared with the at least one constraint provided in S40. If the at least one constraint is complied with, the at least one initial sequence parameter, (e.g., the initial pulse duration $T_i$ and/or the initial amplitude $A_i$), are used unchanged to determine the at least one measurement RF transmit pulse.

If, however, the at least one constraint is not complied with, in S50, the method determines whether at least one adapted sequence parameter complies with the provided at least one constraint. For example, the amplitude is adapted to the value $A_f$ and the pulse duration to the value $T_f$. This adaptation may proceed iteratively, (i.e., a modification of the sequence parameter may be repeatedly carried out), with subsequent checking of the at least one constraint, until the at least one adapted sequence parameter complies with at least one constraint.

If the at least one constraint is complied with on application of a rectangular pulse with the values $T_f$ (for the pulse duration) and $A_f$ (for the amplitude), then these values may be used in S60 as adapted sequence parameters as constraints, (e.g., as maximum pulse duration and maximum amplitude), to determine the at least one measurement RF transmit pulse. Then, for example, a dynamic pulse P may be determined that is shorter than the maximum pulse duration and lower than the maximum amplitude.

It is thus proposed, in particular, to approximate the dynamic pulse P in the calculations with a rectangular pulse that may have the same length as the resultant dynamic pulse and an amplitude that corresponds to the maximum amplitude of the dynamic pulse, and to calculate the actual dynamic pulse only in the final test act after a performable solution has been found.

This is therefore advantageously possible because dynamic pulses conventionally have a very high and virtually constant amplitude over the pulse profile. By approximating this pulse with a rectangular pulse, the actual pulse is indeed "overestimated," but only to a small extent.

In particular, it is proposed to approximate dynamic pulses for calculations of a power requirement applicable to a radio-frequency amplifier and/or an SAR by a rectangular pulse and only after these calculations or in the final test act to calculate the dynamic pulse with the required constraints. This prevents time-consuming recalculation of the dynamic pulses during the, in particular iterative, calculation acts of such calculations being constantly started from scratch.

It should finally once again be noted that the method described above in detail and the depicted magnetic resonance apparatus are merely exemplary embodiments that may be modified in the most varied manner by a person skilled in the art without departing from the scope of the disclosure. Furthermore, use of the indefinite article "a" does not rule out the possibility of a plurality of the features in question also being present. Likewise, the term "unit" does not rule out the possibility of the components in question including a plurality of interacting subcomponents that may optionally also be spatially distributed.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for calculating at least one operating parameter of a magnetic resonance sequence, the method comprising:

providing at least one initial sequence parameter of a dynamic radio-frequency (RF) transmit pulse of the magnetic resonance sequence, wherein the at least one initial sequence parameter of the dynamic RF transmit pulse has a non-rectangular shape, and wherein the at least one initial sequence parameter of the dynamic RF transmit pulse comprises a maximum amplitude;

modeling at least one test RF transmit pulse by adapting the non-rectangular shape of the at least one initial sequence parameter of the dynamic RF transmit pulse to a rectangular shape, wherein the maximum amplitude of the at least one initial sequence parameter corresponds to a maximum height of the rectangular shape;

determining the at least one operating parameter of the magnetic resonance sequence using the at least one test RF transmit pulse having the rectangular shape, wherein the at least one operating parameter comprises a power requirement applicable to a magnetic resonance apparatus during operation of the magnetic resonance sequence and/or a specific absorption rate (SAR) to which a patient is exposed during operation of the magnetic resonance sequence;

comparing the at least one operating parameter with at least one constraint of the power requirement and/or the SAR;

determining at least one adapted sequence parameter by adapting the at least one initial sequence parameter when the at least one operating parameter does not comply with the at least one constraint of the power requirement and/or the SAR;

determining at least one measurement RF transmit pulse, wherein the at least one measurement RF transmit pulse is a dynamic pulse, wherein the determining of the at least one measurement RF transmit pulse uses the at least one initial sequence parameter when the at least one operating parameter complies with the at least one constraint of the power requirement and/or the SAR, and wherein the determining of the at least one measurement RF transmit pulse uses the at least one adapted initial sequence parameter when the at least one operating parameter does not comply with the at least one constraint of the power requirement and/or the SAR; and transmitting the at least one RF transmit pulse during a magnetic resonance measurement.

2. The method of claim 1, wherein the at least one initial sequence parameter comprises a pulse duration that corresponds to a width of the rectangular shape.

3. The method of claim 2, wherein the pulse duration is a maximum pulse duration, and wherein the width of the rectangular shape is a maximum width of the rectangular shape.

4. The method of claim 1, wherein the at least one operating parameter comprises the power requirement applicable to the magnetic resonance apparatus during operation of the magnetic resonance sequence.

5. The method of claim 4, wherein the power requirement is applicable to a RF amplifier of the magnetic resonance apparatus.

6. The method of claim 1, wherein the at least one operating parameter comprises the SAR to which the patient is exposed during operation of the magnetic resonance sequence.

7. The method of claim 1, further comprising:

providing the at least one constraint for the at least one operating parameter.

8. The method of claim 1, wherein the at least one measurement RF transmit pulse is a pTx pulse.

9. The method of claim 1, wherein the at least one adapted sequence parameter comprises the at least one constraint for determining the at least one measurement RF transmit pulse.

10. The method of claim 9, wherein the at least one constraint for determining the at least one measurement RF transmit pulse comprises a maximum pulse duration.

11. The method of claim 9, wherein the at least one constraint for determining the at least one measurement RF transmit pulse comprises the maximum amplitude.

12. A magnetic resonance apparatus comprising:

at least one processor configured to:

provide at least one initial sequence parameter of a dynamic radio-frequency (RF) transmit pulse of a magnetic resonance sequence, wherein the at least one initial sequence parameter of the dynamic RF transmit pulse has a non-rectangular shape, and wherein the at least one initial sequence parameter of the dynamic RF transmit pulse comprises a maximum amplitude;

model at least one test RF transmit pulse by adapting the non-rectangular shape of the at least one initial sequence parameter of the dynamic RF transmit pulse to a rectangular shape, wherein the maximum amplitude of the at least one initial sequence parameter corresponds to a maximum height of the rectangular shape;

determine at least one operating parameter of the magnetic resonance sequence using the at least one test RF transmit pulse having the rectangular shape, wherein the at least one operating parameter comprises a power requirement applicable to the magnetic resonance apparatus during operation of the magnetic resonance sequence and/or a specific absorption rate (SAR) to which a patient is exposed during operation of the magnetic resonance sequence;

compare the at least one operating parameter with at least one constraint of the power requirement and/or the SAR;

determine at least one adapted sequence parameter by adapting the at least one initial sequence parameter when the at least one operating parameter does not comply with the at least one constraint of the power requirement and/or the SAR;

determine at least one measurement RF transmit pulse, wherein the at least one measurement RF transmit pulse is a dynamic pulse, wherein the determining of the at least one measurement RF transmit pulse uses the at least one initial sequence parameter when the at least one operating parameter complies with the at least one constraint of the power requirement and/or the SAR, and wherein the determining of the at least one measurement RF transmit pulse uses the at least one adapted initial sequence parameter when the at least one operating parameter does not comply with the at least one constraint of the power requirement and/or the SAR; and transmit the at least one RF transmit pulse during a magnetic resonance measurement.

13. A non-transitory computer program product that comprises a program and is directly loadable into a memory of a programmable system control unit of a magnetic resonance apparatus, wherein the program, when executed by the programmable system control unit, is configured to cause the magnetic resonance apparatus to:

provide at least one initial sequence parameter of a dynamic radio-frequency (RF) transmit pulse of a magnetic resonance sequence, wherein the at least one initial sequence parameter of the dynamic RF transmit pulse has a non-rectangular shape, and wherein the at least one initial sequence parameter of the dynamic RF transmit pulse comprises a maximum amplitude;

model at least one test RF transmit pulse by adapting the non-rectangular shape of the at least one initial sequence parameter of the dynamic RF transmit pulse to a rectangular shape, wherein the maximum amplitude of the at least one initial sequence parameter corresponds to a maximum height of the rectangular shape;

determine at least one operating parameter of the magnetic resonance sequence using the at least one test RF transmit pulse having the rectangular shape, wherein the at least one operating parameter comprises a power requirement applicable to the magnetic resonance apparatus during operation of the magnetic resonance sequence and/or a specific absorption rate (SAR) to which a patient is exposed during operation of the magnetic resonance sequence;

compare the at least one operating parameter with at least one constraint of the power requirement and/or the SAR;

determine at least one adapted sequence parameter by adapting the at least one initial sequence parameter when the at least one operating parameter does not comply with the at least one constraint of the power requirement and/or the SAR;

determine at least one measurement RF transmit pulse, wherein the at least one measurement RF transmit pulse is a dynamic pulse, wherein the determining of the at least one measurement RF transmit pulse uses the at least one initial sequence parameter when the at least one operating parameter complies with the at least one constraint of the power requirement and/or the SAR, and wherein the determining of the at least one measurement RF transmit pulse uses the at least one adapted initial sequence parameter when the at least one operating parameter does not comply with the at least one constraint of the power requirement and/or the SAR; and transmit the at least one RF transmit pulse during a magnetic resonance measurement.

* * * * *